United States Patent
Fujita

(10) Patent No.: US 6,665,323 B2
(45) Date of Patent: Dec. 16, 2003

(54) SEMICONDUCTOR LASER MODULE CONSTITUTED BY OPTICALLY COUPLING OPTICAL FIBER HAVING FIBER GRATING AND LASER DIODE

(75) Inventor: Takeshi Fujita, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/904,509

(22) Filed: Jul. 16, 2001

(65) Prior Publication Data

US 2002/0097757 A1 Jul. 25, 2002

(30) Foreign Application Priority Data

Nov. 17, 2000 (JP) ......................... 2000-350885

(51) Int. Cl.[7] .............................. H01S 5/0687
(52) U.S. Cl. .................. 372/32; 372/29.02; 372/102
(58) Field of Search ................ 372/98, 102, 32, 372/29.02; 385/31, 88

(56) References Cited

U.S. PATENT DOCUMENTS 4,725,110 A  2/1988  Glenn et al.
6,094,515 A * 7/2000 Miki et al. ............. 385/31
6,335,944 B1 * 1/2002 Mugino et al. .......... 372/2
6,400,736 B1 * 6/2002 Aherne et al. .......... 372/6

FOREIGN PATENT DOCUMENTS

JP  2000-183445  6/2000
JP  2000-194023  7/2000

OTHER PUBLICATIONS

Whalen et al., "Tunable Fibre–Extended–Cavity Laser", Electronics Letters, 26th Mar. 1987, vol. 23, No. 7, pp. 313–314, Institution of Electrical Engineers (IEE), United Kingdom.

* cited by examiner

Primary Examiner—James Davie
(74) Attorney, Agent, or Firm—Burns, Doane, Swecker & Mathis, LLP

(57) ABSTRACT

This semiconductor laser diode module optically couples a laser diode and an optical fiber in which a fiber grating is formed, and a monitor photodiode for an optical output monitor is arranged at the rear of the laser diode. The semiconductor laser diode module improves the optical output characteristics at the optical fiber end versus the current of the monitor diode by setting the reflection center wavelength of the fiber grating to a longer wavelength than the oscillation center wavelength or the gain center wavelength in a laser diode.

8 Claims, 11 Drawing Sheets

SEMICONDUCTOR LASER MODULE CONSTITUTED BY OPTICALLY COUPLING OPTICAL FIBER HAVING FIBER GRATING AND LASER DIODE

BACKGROUND OF THE INVENTION

1. Field of the Invention

The present invention relates to a semiconductor laser module that is constituted by optically coupling an optical fiber having a fiber grating and a laser diode.

2. Description of the Related Art

FIG. 19 is a drawing showing the configuration of a semiconductor laser module 600 shown in "Electronics Letters" Vol. 23, No. 7 published on Mar. 26, 1987. The semiconductor laser module 600 comprises a laser diode (LD) 1, and an optical fiber 2 in which a fiber grating (FG) is formed. The FG is formed in an optical fiber by ultraviolet exposure so that the refractive index of the optical fiber can be periodically changed, and only light having a specific wavelength and of a fixed amount can be reflected, according to the period of change in this refractive index. FIG. 20 is a drawing described in U.S. Pat. No. 4,725,110 showing an appearance when the FG is formed. An FG 5 is formed in an optical fiber 4 using ultraviolet (UV) light from a UV irradiator 3.

FIG. 21 is a drawing showing an optical spectrum (a solid line 6) of an LD when no FG is formed in an optical fiber and an optical spectrum (a solid line 7) of an LD when an FG having the reflection center wavelength of 980 [nm] is formed in the optical fiber. Although the oscillation center wavelength of the LD when no FG is provided is 982 [nm], the oscillation center wavelength when the FG is provided is set to 980 [nm] which is the reflection center wavelength of the FG, and hence it is known that the oscillation center wavelength of the LD is controlled with the FG. Further, if the oscillation center wavelength of the LD when no FG is provided in an optical fiber and the reflection center wavelength of the FG are made to approach each other to some extent, the wavelength characteristics of the light output by the optical fiber can be stabilized. If the gain center wavelength of an LD and the reflection center wavelength of the FG are made to approach to some extent, the wavelength characteristics of light output by the optical fiber can be stabilized.

In a conventional module that returns the light having a specific wavelength to an LD with an FG, when a monitor photodiode that monitors the backlight of the LD at the rear side of the LD is provided, the optical output of an optical fiber versus the current of the monitor photodiode (monitor current) becomes unstable in the low optical output region (in the vicinity of 10 to 40 mW). On the other hand, the optical output versus the operating current of the LD is stable even in the low output region. That is, the FG formed in the optical fiber changes the amount of light of the backlight of the LD and affects the monitor current versus optical output characteristics. In a conventional optical semiconductor module, to keep the optical output of the optical fiber constant, an APC (optical output constant control) circuit may be used in some cases that controls the drive of the LD so that the monitor current can be kept constant, thus keeping the optical output constant. However, it is difficult to control the optical output in the APC circuit if the monitor current versus optical output characteristic becomes unstable.

Further, in such module, a phenomenon called a kink occurs in which the optical output of an optical fiber end does not increase even if the operating current of an LD is increased. Such kinks easily occur due to axis misalignment in the X direction or Y direction of the optical fiber. It is important to suppress the generation of kinks caused by optical axis misalignment of the optical fiber in a semiconductor laser module that requires a high optical output.

SUMMARY OF THE INVENTION

One object of the present invention is to provide a semiconductor laser module in which the monitor current versus optical output characteristics are stabilized. A further object of the present invention is to suppress the generation of kinks caused by optical axis misalignment.

A first semiconductor laser module of the present invention comprises a laser diode that emits light, an optical fiber that transmits the light emitted by the laser diode to the front side, a fiber grating which is formed in the optical fiber and reflects the light in a specific wavelength region mainly having a longer center wavelength than the oscillation center wavelength or gain center wavelength of the laser diode to the laser diode side, and a monitor photodiode that receives the light emitted by the laser diode to the rear side. Thus the monitor current versus optical output characteristics can be stabilized.

A second semiconductor laser module of the present invention comprises a laser diode that emits light, an optical fiber that transmits the light emitted by the laser diode to the front side, a fiber grating having a reflection spectrum half-width of 0.8 nm and over which is formed in the optical fiber and reflects the light in a specific wavelength region, and a monitor photodiode that receives the light emitted by the laser diode to the rear side. Thus, the monitor current versus optical output characteristics can be stabilized.

In the first or second semiconductor laser of the present invention, the optical fiber may also comprise a wedge-shaped tip that functions as a lens arranged so that magnification will become higher than the magnification at which the coupling efficiency between the laser diode and the optical fiber is maximized. Thus, the generation of kinks caused by optical axis misalignment of an optical fiber can be suppressed.

DESCRIPTION OF PREFERRED EMBODIMENTS

Figure 1A:
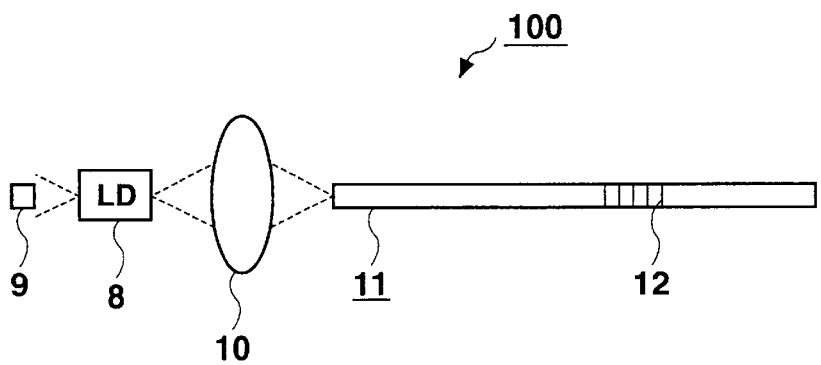
FIG. 1A is a configuration drawing showing the configuration of a semiconductor laser module 100.

FIG. 1A is a configuration drawing showing the configuration of a semiconductor laser module 100. The semiconductor laser module 100 comprises a laser diode (LD) 8, a monitor photodiode 9 that monitors the optical output onto the rear side of the LD 8, a lens 10 that collects the light onto the front side of the LD 8, and an optical fiber 11 on which the light from the lens 10 is incident. A fiber grating (FG) 12 that partially reflects the light in a specific wavelength region among the front light of the LD 8 to the direction of the LD 8 and makes the oscillation center wavelength of the LD 8 stable is formed in the optical fiber 11.

Figure 1B:
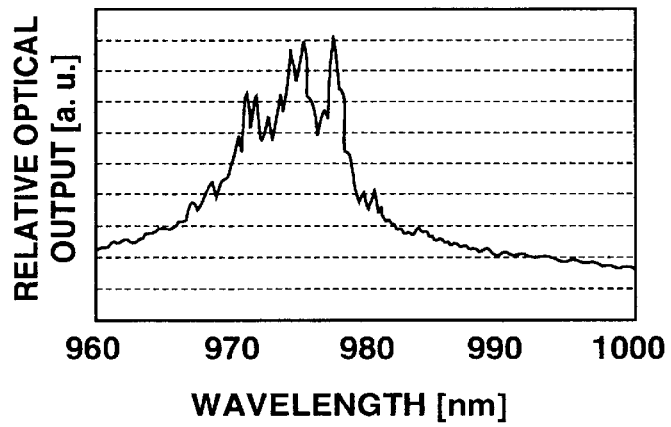
FIG. 1B is a graph showing the oscillation wavelength characteristics of an LD 8 when an FG 12 is not provided in an optical fiber 11.
Figure 1C:
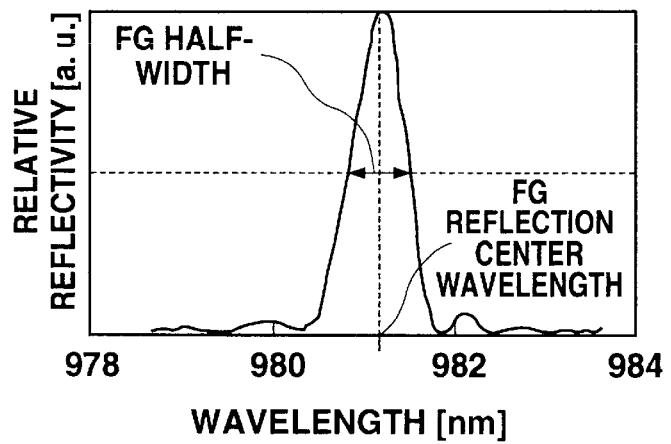
FIG. 1C is a graph showing the reflection wavelength characteristics of the FG 12.

FIG. 1B is a graph showing the oscillation wavelength characteristics of the LD 8 when the FG 12 is not provided in the optical fiber 11. When the FG 12 is not provided, if the relative optical output at a wavelength λi is assumed to be xi and the oscillation center wavelength λ0 of the LD 8 is defined by the formula:

$$\lambda 0 = \Sigma(\lambda i \cdot xi)/\Sigma xi$$

then the oscillation center wavelength λ0 of the LD 8 is set to 976 nm from FIG. 1B. FIG. 1C is a graph showing the reflection wavelength characteristics of the FG 12. This graph indicates that the reflection center wavelength of the FG 12 is set to 981 nm at the longer wavelength side than the oscillation center wavelength λ0 of the LD 8 when the FG 12 is not provided.

Figure 6:
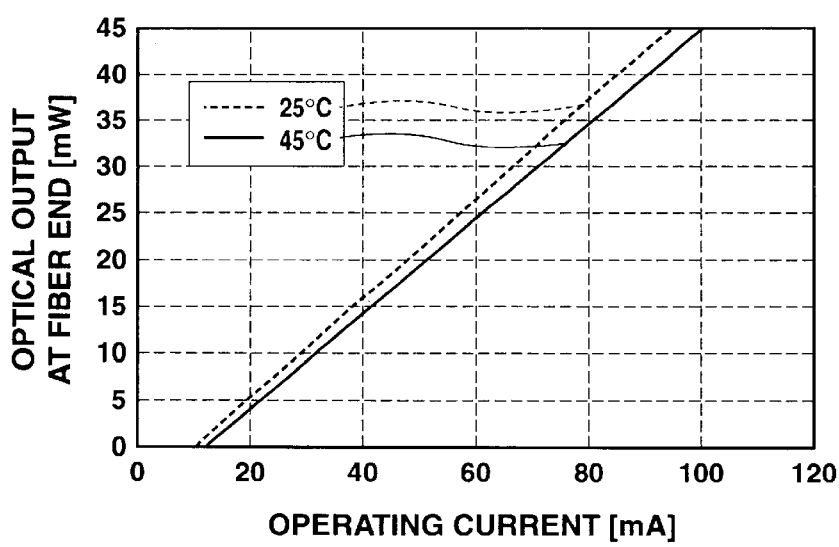
FIG. 6 is a graph showing the operating current versus optical output characteristics of the LD 8 when the oscillation center wavelength λ0 of the LD 8 is set to 976 nm and the reflection center wavelength of the FG 12 is set to 976 nm.
Figure 7:
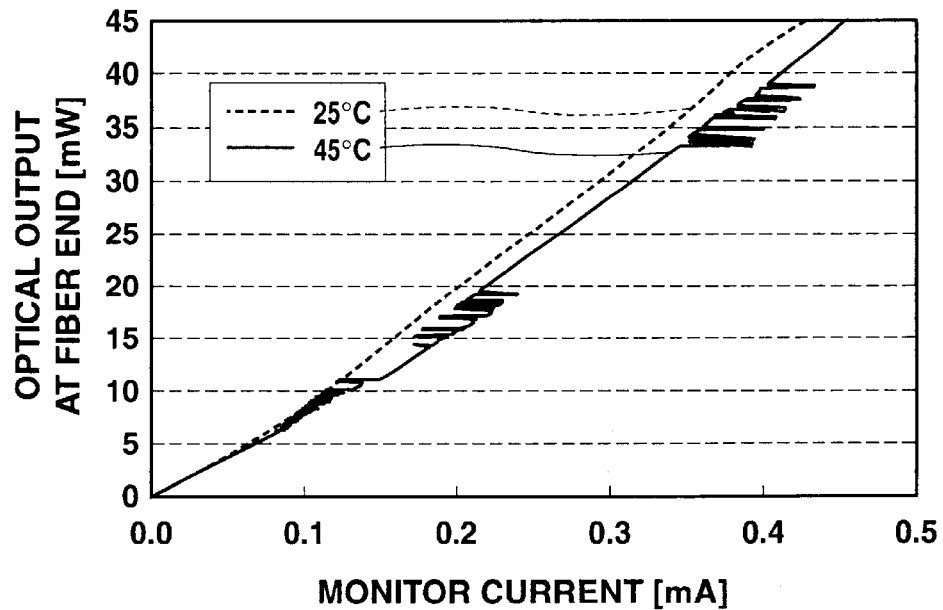
FIG. 7 is a graph showing the monitor current versus optical output characteristics of the LD 8 when the oscillation center wavelength λ0 of the LD 8 is set to 976 nm and the reflection center wavelength of the FG 12 is set to 976 nm.
Figure 8:
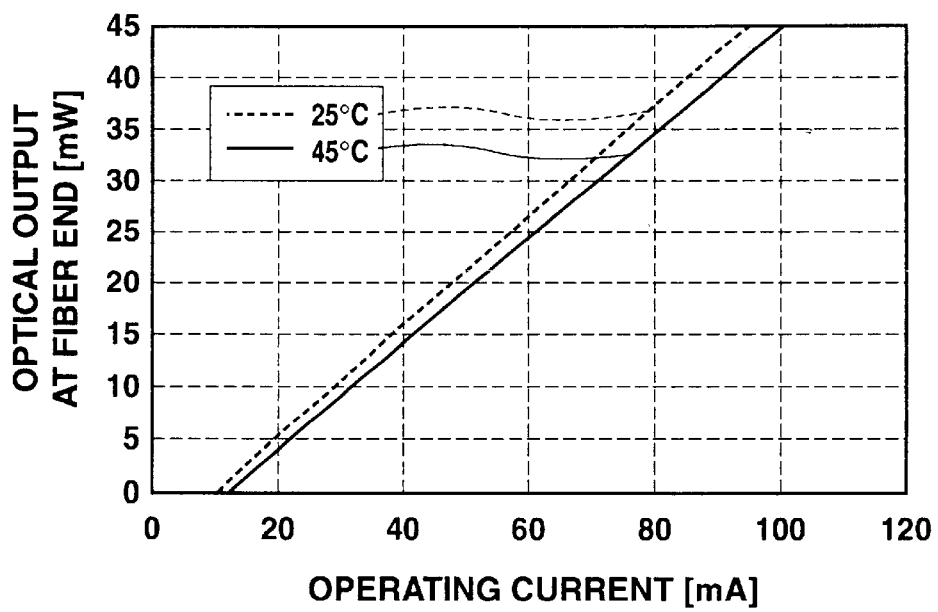
FIG. 8 is a graph showing the operating current versus optical output characteristics of the LD 8 when the oscillation center wavelength λ0 of the LD 8 is set to 976 nm and the reflection center wavelength of the FG 12 is set to 981 nm.
Figure 9:
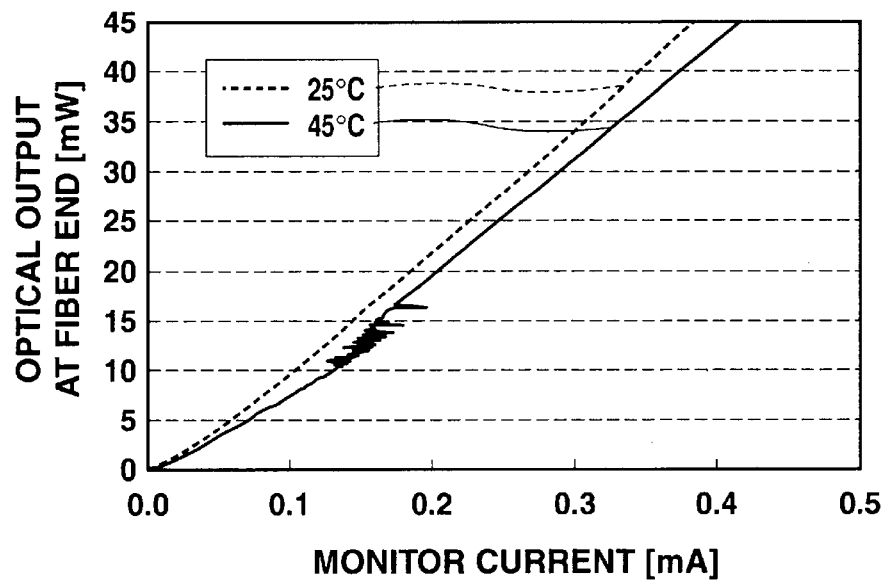
FIG. 9 is a graph showing the monitor current versus optical output characteristics of the LD 8 when the oscillation center wavelength λ0 of the LD 8 is set to 976 nm and the reflection center wavelength of the FG 12 is set to 981 nm.

FIG. 6 shows the operating current versus optical output (optical output at the exit side edge of the optical fiber 11) characteristics of the LD 8 when the oscillation center wavelength λ0 of the LD 8 is set to 976 nm and the reflection center wavelength of the FG 12 is set to 976 nm, and FIG. 7 shows the monitor current (current of the monitor photodiode 9) versus optical output characteristics at that time. Further, FIG. 8 shows the operating current versus optical output characteristics of the LD 8 when the oscillation center wavelength λ0 of the LD 8 is set to 976 nm and the reflection center wavelength of the FG 12 is set to 981 nm, and FIG. 9 shows the monitor current (current of the monitor photodiode 9) versus optical output characteristics at that time. Comparing FIG. 7 and FIG. 9, FIG. 7 shows that the optical output characteristics are unstable in the region up to the vicinity of 12 mW at 25° C. and in the region up to the vicinity of 40 mW at 45° C. On the other hand, FIG. 9 indicates that the optical output characteristics are very stable in all regions at 25° C. and the optical output characteristics are stable in the region above 18 mW even at 45° C. Accordingly, the monitor current versus optical output characteristics can be stabilized by setting the reflection center wavelength of the FG 12 to the longer wavelength side than the oscillation center wavelength of the LD 8. As a result, the optical output can be suitably controlled by an APC circuit.

On the other hand, comparing FIG. 6 and FIG. 8, the operating current versus optical output characteristics in the illustrated region are almost identical. Accordingly, even if the reflection center wavelength of the FG 12 is set to the longer wavelength side than the oscillation center wavelength of the LD 8, the output characteristics of the front light of the LD 8 will not be affected. As a result, the optical output can be suitably controlled also by using an ACC circuit that controls the drive of an LD and keeps the optical output constant so that the operating current of the LD will be constant in order to make the optical output of an optical fiber constant.

Hereupon, the monitor current versus optical output characteristics can be stabilized also by setting the reflection center wavelength to the longer wavelength side than the center wavelength in the gain coefficient versus the wavelength curve of the LD 8 (a gain center wavelength) when an FG is provided in an optical fiber. The gain coefficient is defined by the formula:

$$(g - \alpha_i)\Gamma = \frac{1}{L}\left\{\frac{1}{2}\ln\left(\frac{1}{R_1 R_2}\right) + \ln\left(\frac{\sqrt{Pt(+)} - \sqrt{Pt(-)}}{\sqrt{Pt(+)} + \sqrt{Pt(-)}}\right)\right\}$$ [Formula 1]

In this formula, g indicates a gain coefficient, αi indicates the internal loss of the LD, L indicates the resonator length of the LD, Γ indicates an optical confinement coefficient, R1, R2 indicate the reflectivity of the resonant mirror of the LD, Pt (+) indicates the peak level in the Fabry-Pérot mode and Pt (−) indicates the bottom level in the Fabry-Pérot mode, respectively.

Figure 2A:
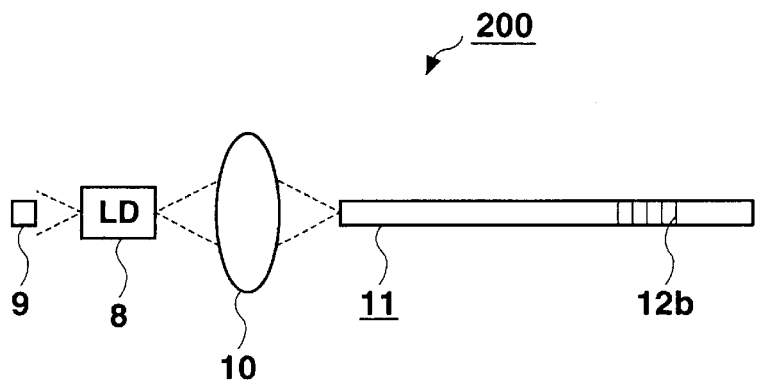
FIG. 2A is a drawing showing the configuration of a semiconductor laser module 200 that is provided with the optical fiber 11 in which an FG 12b having a reflection spectrum half-width of 0.8 nm and over is formed.
Figure 2B:
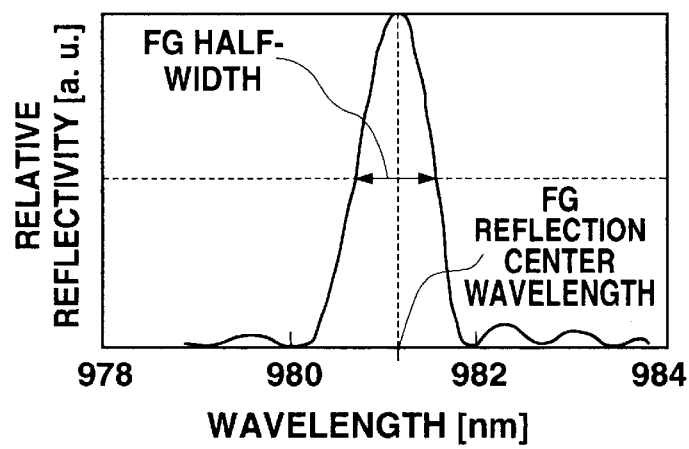
FIG. 2B is a graph showing the reflection wavelength characteristics of the FG 12b.

Moreover, the monitor current versus optical output characteristics can be further improved by changing the half-width of the reflection spectrum of an FG. FIG. 2A is a drawing showing the configuration of a semiconductor laser module 200 provided with the optical fiber 11 on which an FG 12b is formed when the half-width of the reflection spectrum is set to 0.8 nm. Further, FIG. 2B shows the reflection wavelength characteristics of the FG 12b.

The inventor conducted an experiment of measuring the operating current versus optical output characteristics and the monitor current versus optical output characteristics by changing the half-width of the reflection spectrum of the FG 12b from 0.4 nm to 1.2 nm in the semiconductor laser module 200. Here, a typical example shows the case where the half-width of the reflection spectrum of the FG 12b is 0.96 nm. Further, for comparison, the case where the half-width of the reflection spectrum of the FG 12b is 0.66 nm is also shown.

Figure 10:
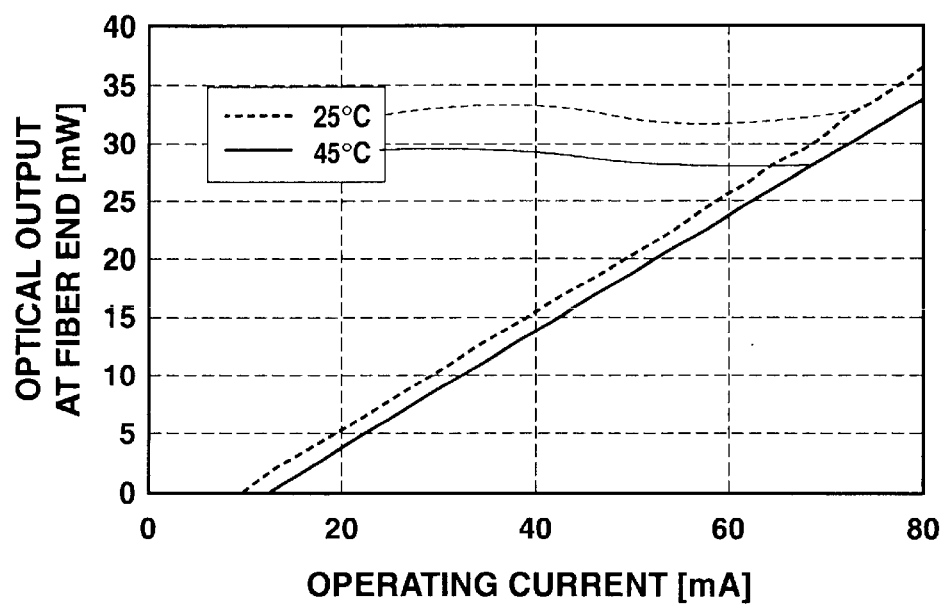
FIG. 10 is a graph showing operating current versus optical output characteristics when the half-width of the reflection spectrum of the FG 12b is set to 0.66 nm.
Figure 11:
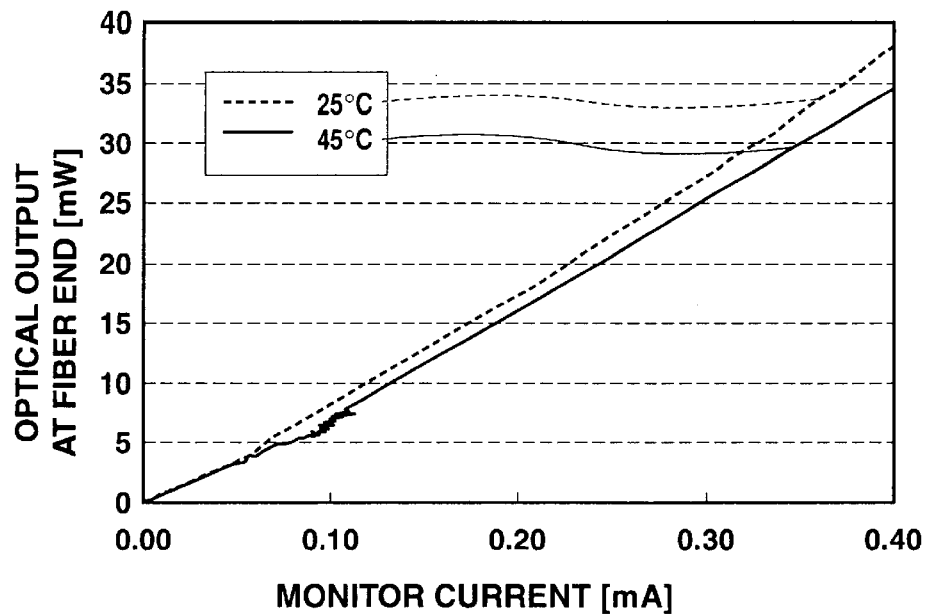
FIG. 11 is a graph showing monitor current versus optical output characteristics when the half-width of the reflection spectrum of the FG 12b is set to 0.66 nm.
Figure 12:
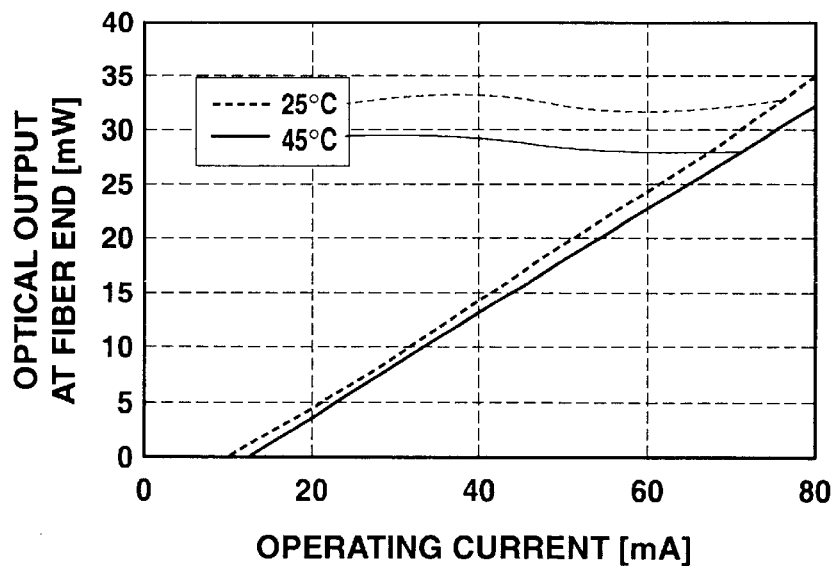
FIG. 12 is a graph showing operating current versus optical output characteristics when the half-width of the reflection spectrum of the FG 12b is set to 0.96 nm.
Figure 13:
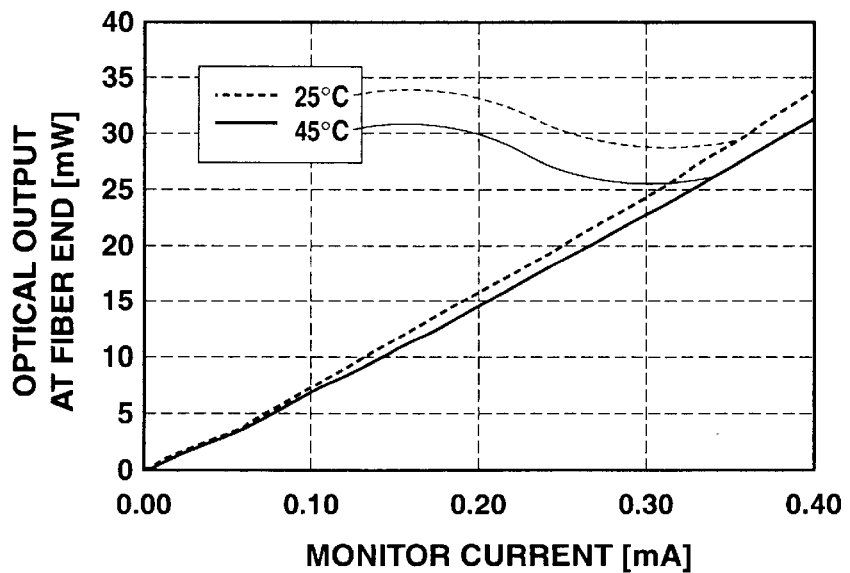
FIG. 13 is a graph showing monitor current versus optical output characteristics when the half-width of the reflection spectrum of the FG 12b is set to 0.96 nm.

FIG. 10 shows the operating current versus optical output characteristics when the half-width of the reflection spectrum of the FG 12b is set to 0.66 nm, and FIG. 11 shows the monitor current versus optical output characteristics at that time. Further, FIG. 12 shows the operating current versus optical output characteristics when the half-width of the reflection spectrum of the FG 12b is set to 0.96 nm, and FIG. 13 shows the monitor current versus optical output characteristics at that time. Comparing FIG. 11 and FIG. 13, FIG. 11 shows that the optical output characteristics are unstable in the region up to the vicinity of 5 mW at 25° C. and in the region up to the vicinity of 9 mW at 45° C. On the other hand, FIG. 13 shows that the optical output characteristics are very stable at 25° C. and the optical output characteristics are stable in the region above 5 mW even at 45° C. Thus, setting the half-width of the reflection spectrum of the FG 12b to 0.8 nm or more can stabilize the monitor current versus optical output characteristics.

Further, comparing FIG. 10 and FIG. 12, the operating current versus optical output characteristics in the illustrated region are almost identical. Thus, even if the half-width of the FG 12b is changed, the characteristics of the front light of the LD 8 will not be affected.

Figure 3:
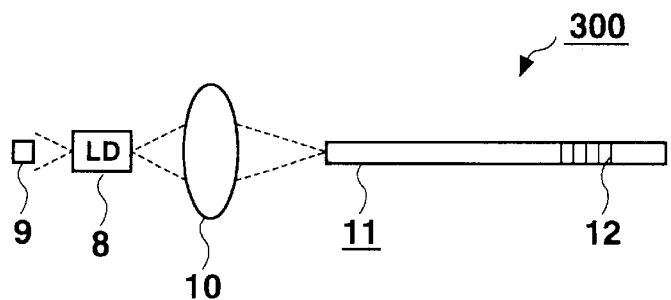
FIG. 3 is a drawing showing an outline of the configuration of a semiconductor laser module 300 in which a lens 10 is arranged so that the lens has a higher magnification than the magnification at which the coupling efficiency between the LD8 and the optical fiber 11 is maximized.

In the semiconductor laser module 100, characteristics can be further improved by changing the magnification of the lens 10. FIG. 3 is a drawing showing an outline of the configuration of a semiconductor laser module 300 in which the lens 10 is arranged so that a higher magnification is achieved than the magnification at which the coupling efficiency between the LD 8 and the optical fiber 11 is maximized.

In general, when the mode field diameter in the horizontal direction of an LD is $\omega_{x1}$, the mode field diameter in the vertical direction of the LD is $\omega_{y1}$, the mode field diameter in the horizontal direction of an optical fiber is $\omega_{x2}$ and the mode field diameter in the vertical direction of the optical fiber is $\omega_{y2}$, then the magnification m at which the coupling efficiency between the LD and the optical fiber is maximized is given by the formula:

$$m = \sqrt{\frac{\omega_{x2} \times \omega_{y2}}{\omega_{x1} \times \omega_{y1}}}$$ [Formula 2]

Figure 14:
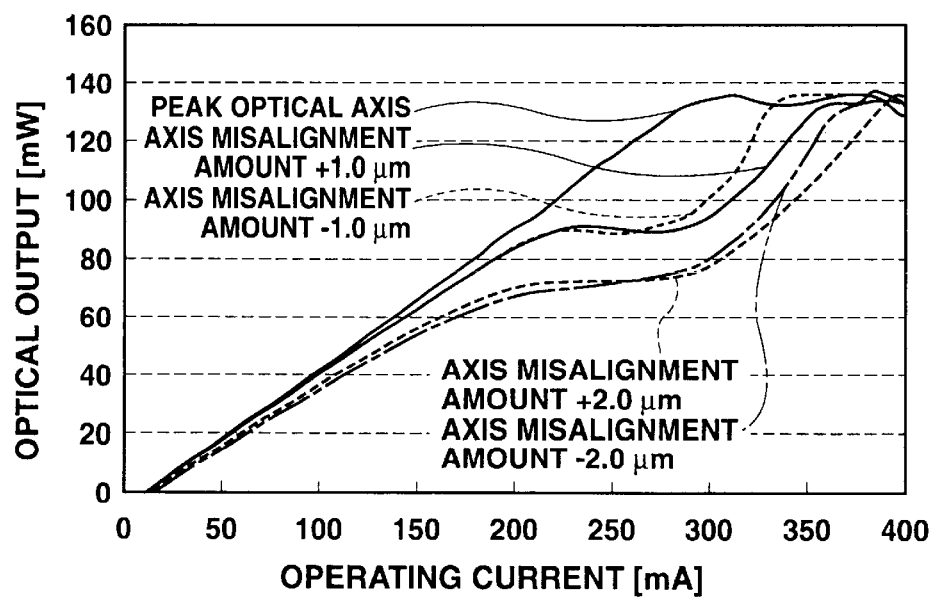
FIG. 14 is a graph showing the result in which the operating current versus optical output characteristics are measured when the optical axis misalignment of the optical fiber 11 occurred and the lens 10 is arranged so that the coupling magnification will be 3.2 times.
Figure 15:
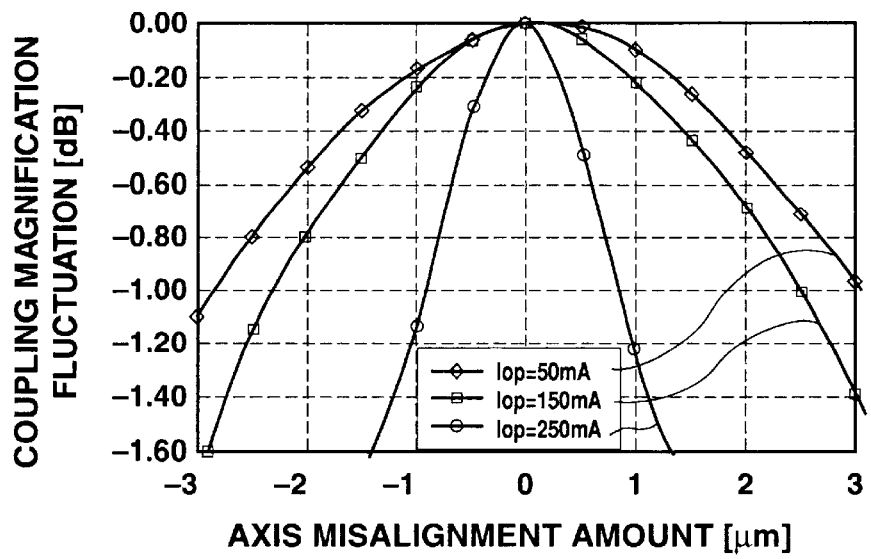
FIG. 15 is a graph showing the result in which a fiber tolerance curve is measured when the lens 10 is arranged so that the coupling magnification will be 3.2 times.
Figure 16:
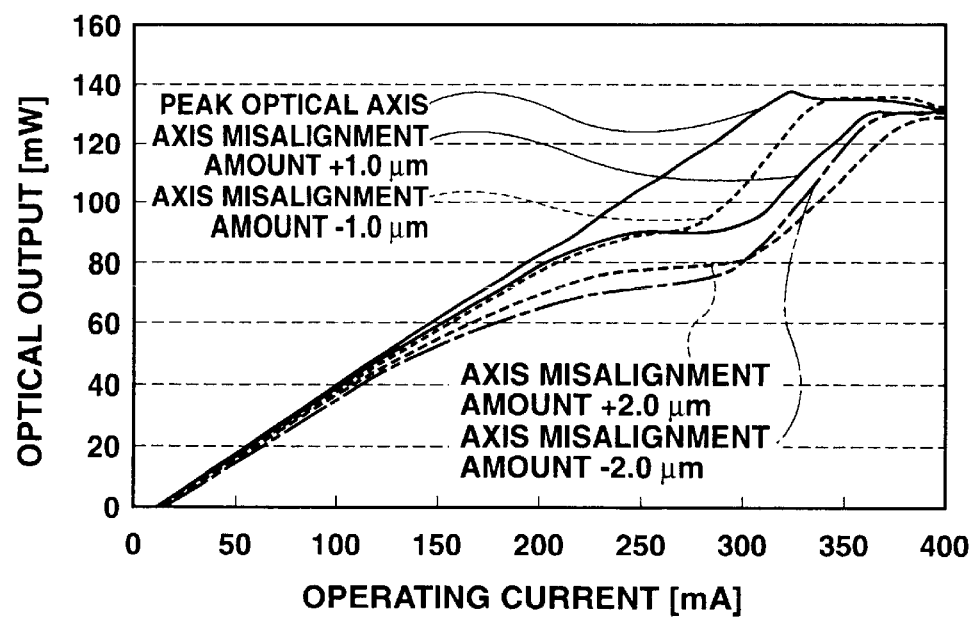
FIG. 16 is a graph showing the result in which the operating current versus optical output characteristics are measured when the optical axis misalignment of the optical fiber 11 occurred and the lens 10 is arranged so that the coupling magnification will be 4.5 times.
Figure 17:
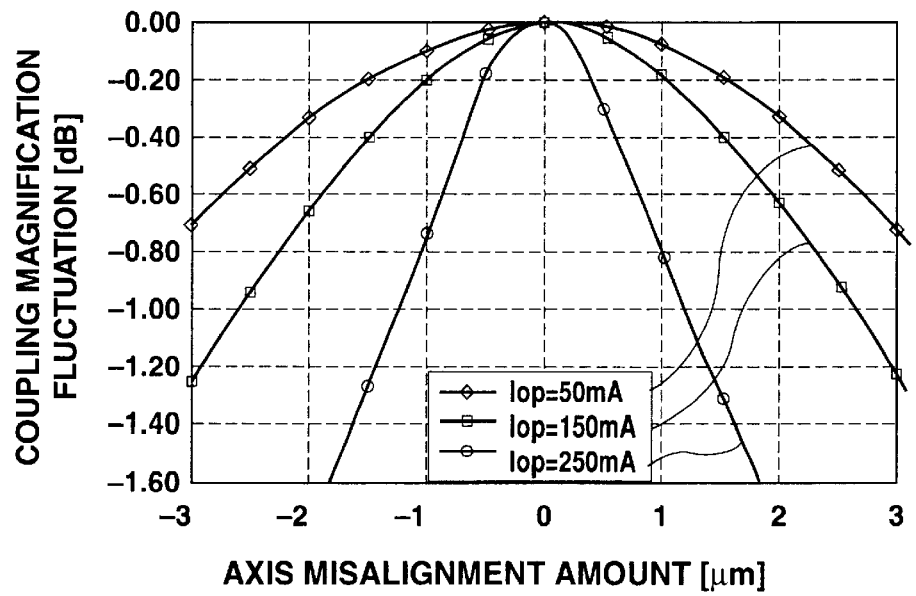
FIG. 17 is a graph showing the result in which a fiber tolerance curve is measured when the lens 10 is arranged so that the coupling magnification will be 4.5 times.

In the semiconductor laser module 300, the LD 8 is an elliptic shape having the mode field diameter of about 3.2 μm in the horizontal direction and the mode field diameter of about 1.3 μm in the vertical direction. Further, the optical fiber 11 is a polarization maintaining fiber, and the mode field diameter is about 6.6 μm. At this time, from Formula 1 the magnification at which the coupling efficiency between the LD 8 and the optical fiber 11 is maximized reaches about 3.2 times. FIG. 14 is a graph showing the result in which the operating current versus optical output characteristics were measured when the optical axis misalignment occurred and the lens 10 was arranged so that the coupling magnification will be 3.2 times, and FIG. 15 is a graph showing the measured fiber tolerance curve at this time. FIG. 16 is a graph showing the measured operating current versus optical output characteristics when the optical axis misalignment occurred and the lens 10 was arranged so that the coupling magnification will be 4.5 times, and FIG. 17 is a graph showing the measured fiber tolerance curve at this time. Comparing FIG. 14 and FIG. 16, it can be seen that it is harder for kinks caused by optical axis misalignment of the optical fiber 11 to occur when the coupling magnification is 4.5 times. Further, comparing FIG. 15 and FIG. 17, it can be seen that the amount of axis misalignment when the optical output is decreased by 0.5 dB for the 50 mA operating current is about 3.8 μm at the coupling magnification of 3.2 times and about 4.9 μm at the magnification of about 4.5 times, and so the tolerance of axis misalignment is relaxed by about 1.3 times. Thus, by arranging the lens 10 having a higher magnification than the magnification at which the coupling efficiency between the LD 8 and the optical fiber 11 is maximized, the generation of kinks caused by the optical axis misalignment of the optical fiber 11 can be suppressed. Also, the axis misalignment tolerance of the optical fiber 11 can be relaxed and so production yield can be improved.

Figure 4:
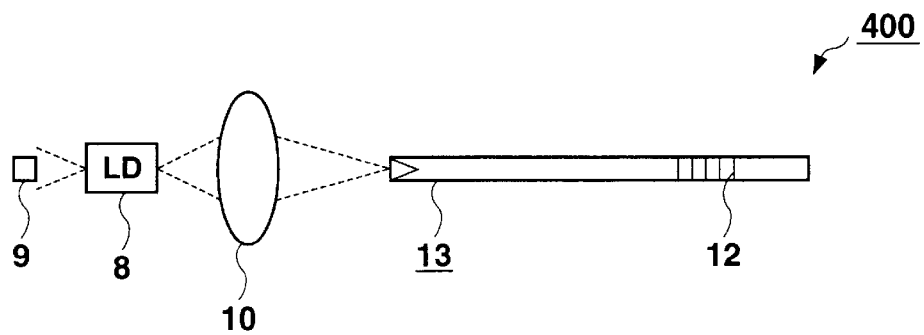
FIG. 4 is a drawing showing an outline of the configuration of a semiconductor laser module 400 having a core-expanded fiber 13 in which the mode field diameter of the core portion is expanded by heat treatment.

In the semiconductor laser module 100, characteristics can be improved by changing the core shape of the optical fiber 11. FIG. 4 is a drawing showing an outline of the configuration of a semiconductor laser module 400 having a core-expanded fiber 13 in which an optical fiber is heat-treated and the mode field diameter for the core portion of the optical fiber is expanded. Since the mode field diameter for the core portion of the core-expanded fiber 13 is expanded, the coupling efficiency between the LD 8 and the core-expanded fiber 13 is further improved and an efficient semiconductor laser is higher than the case where a normal optical fiber (for example, the optical fiber 11 shown in FIG. 1) is used. Further, when the optical fiber is a polarization maintaining fiber, the core portion can be expanded in an elliptic shape according to the shape of the portion where stress is applied. As a result, when the LD 8 emits elliptic light, the coupling efficiency can be further improved and a more efficient semiconductor laser can be realized than the case where the LD is coupled with an optical fiber of circular cross section.

Figure 5:
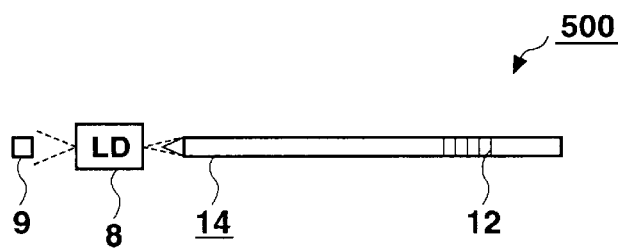
FIG. 5 is a diagram showing an outline of the configuration of a semiconductor laser module 500 having a wedge-shaped fiber 14 in which the tip of an optical fiber is processed into a wedge shape.

FIG. 5 is a drawing showing an outline of a semiconductor laser module 500 having a wedge-shaped fiber 14 in which the tip of an optical fiber is processed into a wedge shape. Thus, when the LD 8 emits elliptic light, the coupling efficiency can be improved and the number of parts can be reduced because the lens 10 is unnecessary. As a result, a low-loss and low-priced semiconductor laser module can be realized.

Figure 18:
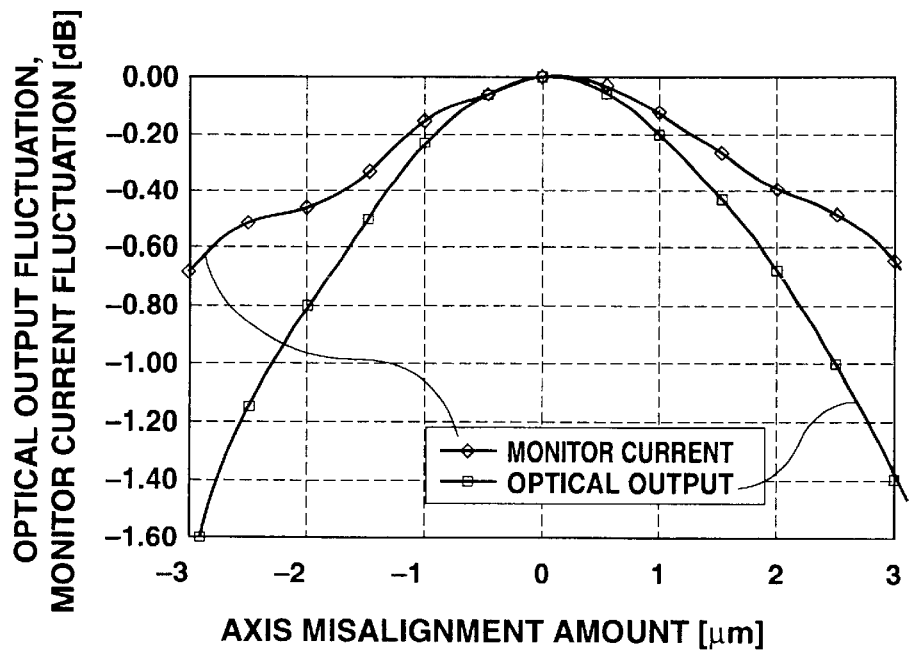
FIG. 18 is a graph showing the fluctuation of optical output and fluctuation of monitor current versus the optical axis misalignment of an optical fiber.
Figure 19:
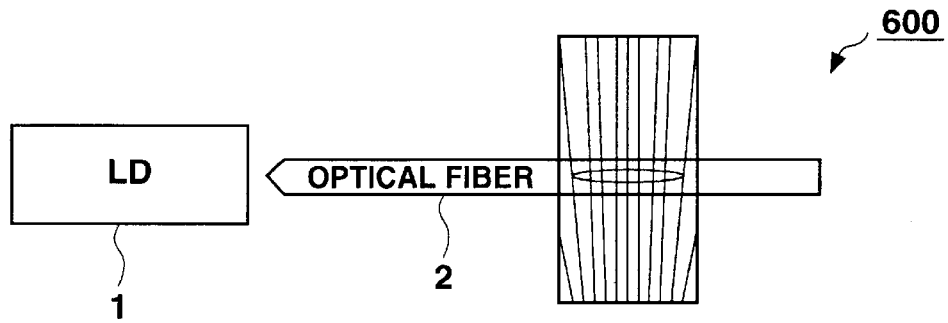
FIG. 19 is a drawing showing the configuration of a semiconductor laser module 600.
Figure 20:
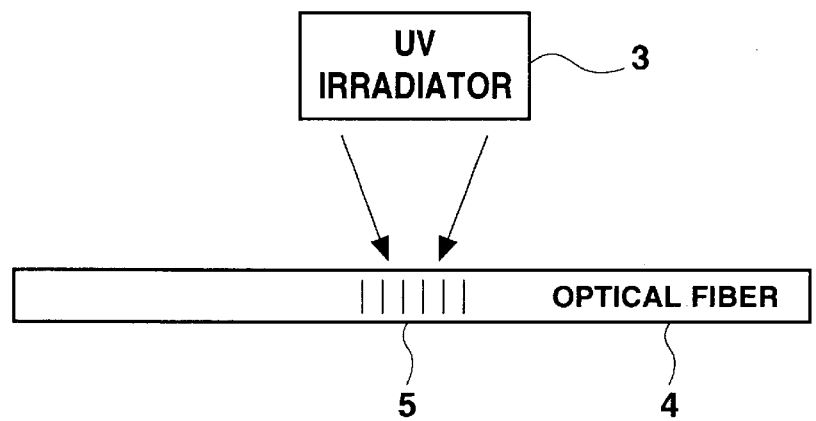
FIG. 20 is a drawing showing an appearance in which the FG described in U.S. Pat. No. 4,725,110 is formed.
Figure 21:
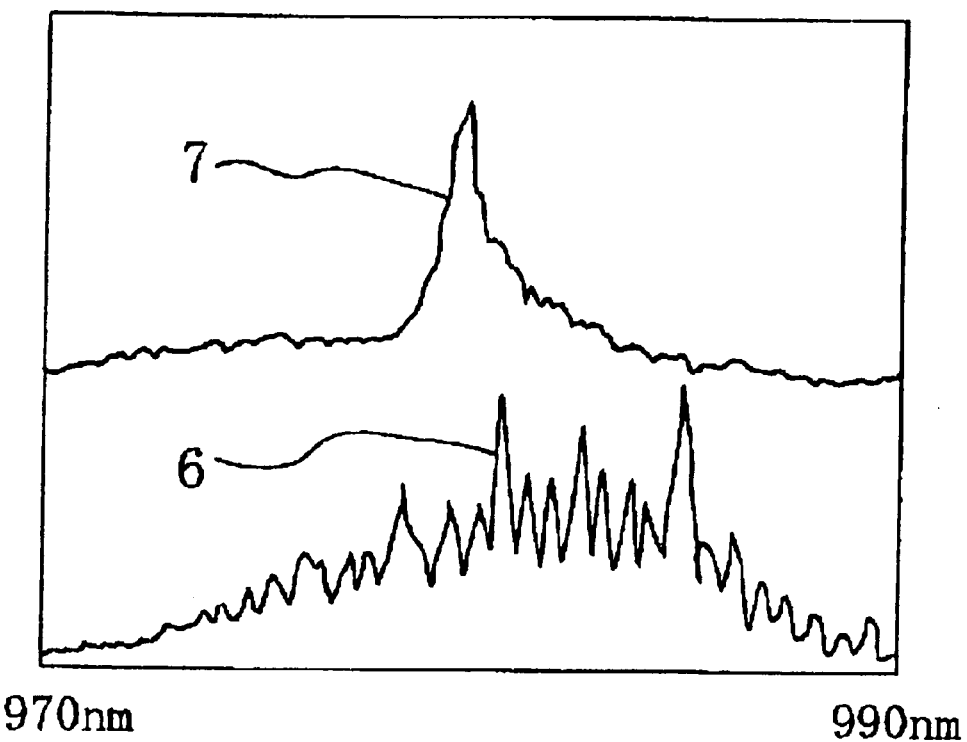
FIG. 21 is a drawing showing an optical spectrum of an LD when no FG is formed in an optical fiber and an optical spectrum of an LD when an FG having a reflection center wavelength of 980 nm is formed in the optical fiber.

In each of the semiconductor laser modules, the tracking error caused by the optical axis misalignment of the optical fiber can be compensated using the monitor photodiode 9 at the rear of the LD. FIG. 18 is a graph showing the fluctuation of optical output and the fluctuation of monitor current versus the optical axis misalignment of the optical fiber. This drawing shows that the optical output is decreased by the optical axis misalignment of the optical fiber and the monitor current is also decreased. This is because the amount of light that is returned from the FG to the LD changes and the optical output of the backlight of the LD is decreased. Accordingly, the optical axis misalignment can indirectly be measured by measuring the monitor current using a monitor diode. Consequently, if APC control is performed as a result of which the monitor current is kept constant and the optical output is controlled, the operating current of the LD can be increased so that the decrease of optical output caused by the optical axis misalignment can be compensated and the tracking error can be compensated.

What is claimed is:

1. A semiconductor laser module comprising:
   a laser diode that emits light;
   an optical fiber that transmits the light emitted by the laser diode to the front side;
   a fiber grating that is formed in the optical fiber and reflects the light in a specific wavelength region mainly consisting of a longer wavelength than the oscillation center wavelength or the gain center wavelength of the laser diode;
   a monitor photodiode that receives the light emitted by the laser diode to the rear side; and
   a lens that is arranged so that magnification is larger than the magnification at which the coupling efficiency between the laser diode and the optical fiber is maximized.

2. The semiconductor laser module according to claim 1, wherein the optical fiber is a core-expanded fiber.

3. A semiconductor laser module comprising:
   a laser diode that emits light;
   an optical fiber that transmits the light emitted by the laser diode to the front side;
   a fiber grating that is formed in the optical fiber and reflects the light in a specific wavelength region mainly consisting of a longer wavelength than the oscillation center wavelength or the gain center wavelength of the laser diode; and
   a monitor photodiode that receives the light emitted by the laser diode to the rear side,
   wherein the optical fiber comprises a wedge-shaped tip that functions as a lens arranged so that magnification is larger than the magnification at which the coupling efficiency between the laser diode and the optical fiber is maximized.

4. A semiconductor laser module comprising:
   a laser diode that emits light;
   an optical fiber that transmits the light emitted by the laser diode to the front side;
   a fiber grating that is formed in the optical fiber and reflects the light in a specific wavelength region mainly consisting of a longer wavelength than the oscillation center wavelength or the gain center wavelength of the laser diode, the fiber grating having a half-width of a reflection spectrum being greater than or equal to 0.8 nm; and
   a monitor photodiode that receives the light emitted by the laser diode to the rear side.

5. The semiconductor laser module according to claim 4, further comprising a lens that is arranged so that magnification is larger than the magnification at which the coupling efficiency between the laser diode and the optical fiber is maximized.

6. The semiconductor laser module according to claim 4, wherein the optical fiber is a core-expanded fiber.

7. The semiconductor laser module according to claim 4, wherein the optical fiber is a wedge-shaped fiber.

8. The semiconductor laser module according to claim 4, wherein the optical fiber comprises a wedge-shaped tip that functions as a lens arranged so that magnification is larger than the magnification at which the coupling efficiency between the laser diode and the optical fiber is maximized.

* * * * *